United States Patent
Motz (10) Patent No.: US 7,710,298 B2
(45) Date of Patent: May 4, 2010

(54) INTEGRATED CIRCUIT WITH AUTO-ZEROING COMPARATOR STAGES THAT PROVIDE A CONTINUOUS-TIME SIGNAL

(75) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 12/166,066

(22) Filed: Jul. 1, 2008

(65) Prior Publication Data
US 2010/0001887 A1    Jan. 7, 2010

(51) Int. Cl.
H03M 1/06    (2006.01)
(52) U.S. Cl. .................... 341/118; 327/554
(58) Field of Classification Search ......... 341/118–155; 327/94, 337, 554; 330/9
See application file for complete search history.

(56) References Cited

U.S. PATENT DOCUMENTS

| | | | |
|---|---|---|---|
| 5,397,936 A | 3/1995 | Wang | |
| 5,499,465 A * | 3/1996 | Manico | 40/717 |
| 5,604,433 A | 2/1997 | Theus et al. | |
| 6,011,417 A | 1/2000 | Ezell et al. | |
| 6,218,975 B1 * | 4/2001 | Tsukamoto et al. | 341/159 |
| 6,369,743 B2 * | 4/2002 | Ono | 341/159 |
| 6,420,983 B1 * | 7/2002 | Feygin et al. | 341/118 |
| 6,476,671 B1 * | 11/2002 | Tang | 330/9 |
| 6,674,322 B2 | 1/2004 | Motz | |
| 6,727,693 B2 | 4/2004 | Altrichter et al. | |
| 6,822,597 B2 | 11/2004 | Draxelmayr et al. | |
| 7,064,693 B1 | 6/2006 | Huang et al. | |
| 7,333,915 B2 | 2/2008 | Motz | |
| 7,394,309 B1 * | 7/2008 | Potanin et al. | 327/554 |
| 7,405,988 B2 * | 7/2008 | Tran et al. | 365/208 |
| 7,511,645 B1 * | 3/2009 | Ranucci | 341/120 |
| 2003/0231129 A1 | 12/2003 | Draxelmayr et al. | |
| 2004/0032246 A1 | 2/2004 | Motz | |

OTHER PUBLICATIONS

K. A.A. Makinwa, "Dynamic Offset-Cancellation Techniques"; Smart Sensor Systems 2002; 42 pgs.
K. A.A. Makinwa, "Low-Offset DC Amplifiers for Sensors"; IEEE Sensors 2004; 17 pgs.
K. A.A. Makinwa, "Smart Sensor Design: The Art of Compensation and Cancellation"; undated; 7 pgs.

* cited by examiner

Primary Examiner—Lam T Mai
(74) Attorney, Agent, or Firm—Dicke, Billig & Czaja, PLLC (57) ABSTRACT

An integrated circuit includes first and second inputs configured to receive an input signal. A plurality of comparator stages is coupled in parallel to the first and second inputs. Each comparator stage is configured to perform a comparison on the input signal and provide an output signal based on the comparison. A control circuit is configured to cause the comparator stages to switch to an auto-zeroing mode in a staggered manner, thereby compensating offset voltages of the comparator stages while providing a continuous-time digital output signal.

20 Claims, 5 Drawing Sheets

INTEGRATED CIRCUIT WITH AUTO-ZEROING COMPARATOR STAGES THAT PROVIDE A CONTINUOUS-TIME SIGNAL

BACKGROUND

If an operational amplifier is operated without negative feedback, then a comparator is obtained. Because of the generally high gain of operational amplifiers, an operational amplifier that is configured as a comparator is suitable for comparing two voltages with high precision. A comparator maps an analog input signal into a digital (binary) output signal. Comparators are used, for example, in the evaluation of sensor signals.

Sensors that use comparators are employed in a wide range of technological applications including automotive, industrial and consumer applications. These applications need sensors that operate reliably according to specified performance characteristics. For this reason, sensors are calibrated to offset deviations in sensor performance, such as those due to comparator offset voltages, to help ensure that measurements are performed accurately.

SUMMARY

One embodiment provides an integrated circuit that includes first and second inputs configured to receive an input signal. A plurality of comparator stages is coupled in parallel to the first and second inputs. Each comparator stage is configured to perform a comparison on the input signal and provide an output signal based on the comparison. A control circuit is configured to cause the comparator stages to switch to an auto-zeroing mode in a staggered manner, thereby compensating offset voltages of the comparator stages while providing a continuous-time digital output signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides an offset-compensated continuous-time (non-sampled) comparator device with a high time resolution, a high degree of switching threshold accuracy, and relatively small space (area) requirements.

Figure 1:
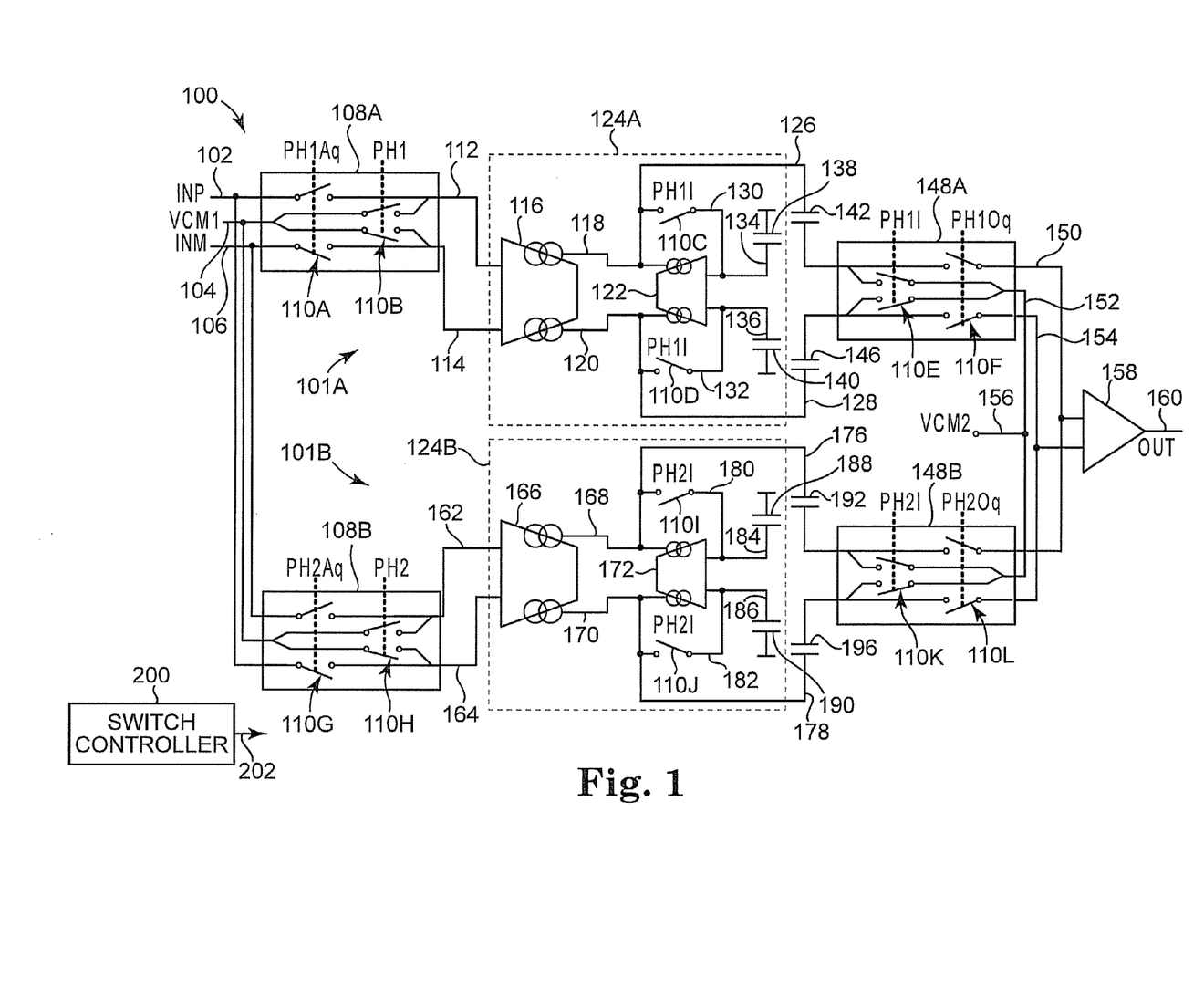
FIG. 1 is a diagram illustrating a continuous-time comparator device with offset compensation according to one embodiment.

FIG. 1 is a diagram illustrating a continuous-time comparator device 100 with offset compensation according to one embodiment. Comparator device 100 includes two auto-zeroing comparator stages 101A and 101B and output amplifier 158. The comparator stages 101A and 101B are coupled in parallel between differential inputs 102 and 106 of device 100 and differential outputs 150 and 154. Comparator stage 101A includes input multiplexer 108A, auto-zeroing comparator 124A, coupling capacitors 142 and 146, and output multiplexer 148A. Coupling capacitors 142 and 146 capacitively couple outputs of auto-zeroing comparator 124A to output multiplexer 148A and output amplifier 158. Input multiplexer 108A includes input switches 110A and 110B. Output multiplexer 148A includes output switches 110E and 110F. Auto-zeroing comparator 124A includes operational transconductance amplifier (OTA) 116, OTA 122, switches 110C and 110D, and differential capacitors 138 and 140. In one embodiment, OTA 122 has a transconductance value (GM/10), which is one tenth the transconductance value (GM) of OTA 116.

Input multiplexer 108A is coupled to differential inputs 102 and 106 (INP and INM, respectively), and is coupled to common mode input potential 104 (VCM1). Differential inputs 102 and 106 are configured to be coupled to respective first and second inputs of OTA 116 through switches 110A and signal paths 112 and 114, respectively. Common mode potential 104 is configured to be coupled to the first and second inputs of OTA 116 through switches 110B and signal paths 112 and 114. First and second outputs of OTA 116 are coupled to signal paths 118 and 120, respectively. Capacitor 138 is coupled between a voltage source (or ground), and a first input of OTA 122 (via signal path 134). Capacitor 140 is coupled between the voltage source (or ground), and a second input of OTA 122 (via signal path 136). First and second outputs of OTA 122 are coupled to signal paths 118 and 120, respectively. The first output of OTA 122 is configured to be coupled to the first input of OTA 122 through feedback signal path 130 and switch 110C. The second output of OTA 122 is configured to be coupled to the second input of OTA 122 through feedback signal path 132 and switch 110D.

The first outputs of OTAs 116 and 122 are coupled to coupling capacitor 142 through signal paths 118 and 126. The second outputs of OTAs 116 and 122 are coupled to coupling capacitor 146 through signal paths 120 and 128. Coupling capacitors 142 and 146 are configured to be coupled to respective first and second inputs of output amplifier 158 through switches 110F and differential signal paths 150 and 154, respectively. Coupling capacitors 142 and 146 are also configured to be coupled to common mode output potential 156 (VCM2) through switches 110E and common mode signal path 152.

In the illustrated embodiment, comparator stage 101B includes the same elements and is configured in the same manner as comparator stage 101A. Comparator stage 101B includes input multiplexer 108B, auto-zeroing comparator 124B, coupling capacitors 192 and 196, and output multiplexer 148B. Coupling capacitors 192 and 196 capacitively couple outputs of auto-zeroing comparator 124B to output multiplexer 148B and output amplifier 158. Input multiplexer 108B includes input switches 110G and 110H. Output multiplexer 148B includes output switches 110K and 110L. Auto-zeroing comparator 124B includes operational transconductance amplifier (OTA) 166, OTA 172, switches 110I and 110J, and differential capacitors 188 and 190. In one embodiment, OTA 172 has a transconductance value (GM/10), which is one tenth the transconductance value (GM) of OTA 166.

Input multiplexer 108B is coupled to differential inputs 102 and 106 (INP and INM, respectively), and is coupled to common mode input potential 104 (VCM1). Differential inputs 102 and 106 are configured to be coupled to respective first and second inputs of OTA 166 through switches 110G and signal paths 162 and 164, respectively. Common mode potential 104 is configured to be coupled to the first and second inputs of OTA 166 through switches 110H and signal paths 162 and 164. First and second outputs of OTA 166 are coupled to signal paths 168 and 170, respectively. Capacitor 188 is coupled between a voltage source (or ground), and a first input of OTA 172 (via signal path 184). Capacitor 190 is coupled between the voltage source (or ground), and a second input of OTA 172 (via signal path 186). First and second outputs of OTA 172 are coupled to signal paths 168 and 170, respectively. The first output of OTA 172 is configured to be coupled to the first input of OTA 172 through feedback signal path 180 and switch 110T. The second output of OTA 172 is configured to be coupled to the second input of OTA 172 through feedback signal path 182 and switch 110J.

The first outputs of OTAs 166 and 172 are coupled to coupling capacitor 192 through signal paths 168 and 176. The second outputs of OTAs 166 and 172 are coupled to coupling capacitor 196 through signal paths 170 and 178. Coupling capacitors 192 and 196 are configured to be coupled to respective first and second inputs of output amplifier 158 through switches 110L and differential signal paths 150 and 154, respectively. Coupling capacitors 192 and 196 are also configured to be coupled to common mode output potential 156 (VCM2) through switches 110K and common mode signal path 152. Output amplifier 158 amplifies signals received at its inputs on signal paths 150 and 154 and outputs a digital (binary) comparator output signal (OUT) on signal path 160.

In one embodiment, comparator device 100 includes a switch controller 200 for generating switch control signals 202 that control switches 110A-110L. In one embodiment, comparator device 100 and switch controller 200 are implemented together in a common integrated circuit. In another embodiment, comparator device 100 and switch controller 200 are implemented with separate integrated circuits. Control signals 202, and the operation of comparator device 100 according to one embodiment, are described in further detail below with reference to FIG. 2.

Figure 2:
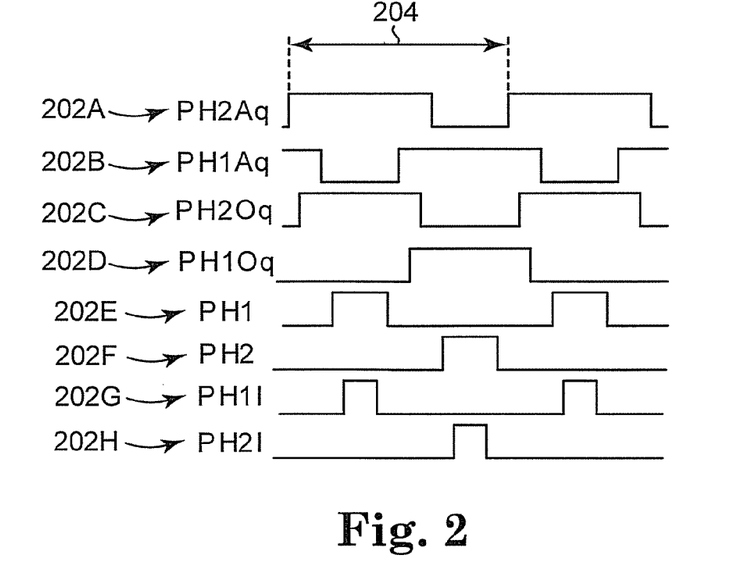
FIG. 2 is a timing diagram illustrating switch control signals for controlling switches of the comparator device shown in FIG. 1 according to one embodiment.

FIG. 2 is a timing diagram illustrating switch control signals 202A-202H (collectively referred to as switch control signals 202) for controlling switches 110A-110L (collectively referred to as switches 110) of the comparator device 100 shown in FIG. 1 according to one embodiment. In one embodiment, a high value or state for any of the switch signals 202 shown in FIG. 2 indicates that the switches 110 controlled by that signal are closed, and a low value or state indicates that the switches are open. Control signal 202A (PH2Aq) controls switches 110G. Control signal 202B (PH1Aq) controls switches 110A. Control signal 202C (PH2Oq) controls switches 110L. Control signal 202D (PH1Oq) controls switches 110F. Control signal 202E (PH1) controls switches 110B. Control signal 202F (PH2) controls switches 110H. Control signal 202G (PH1I) controls switches 110C, 110D, and 110E. Control signal 202H (PH2I) controls switches 110I, 110J, and 110K.

In one embodiment, switch control signals 202 are cyclical and are configured to cause auto-zeroing OTAs 124A and 124B to switch back and forth between an auto-zeroing mode of operation and a normal mode of operation, such that when one of the auto-zeroing OTAs (e.g., 124A) is in a normal mode, the other auto-zeroing OTA (e.g., 124B) is in a auto-zeroing mode. Thus, the auto-zeroing is staggered in time so that the OTAs 124A and 124B take turns going into an auto-zeroing mode, and then the cycle is repeated. One cycle is represented in FIG. 2 by reference number 204. In one embodiment, at least one of the OTAs 124A and 124B is in a normal mode at any given time to provide continuous normal operation of the comparator device 100 and the time-continuous generation of an output signal from comparator device 100.

As shown in FIG. 2, control signal 202A starts out in a low state, and then is the first signal in the illustrated embodiment to switch states (from low to high). When control signal 202A switches to a high state, switches 110G close, which causes the differential inputs 102 and 106 to be coupled to the inputs of OTA 166. The next control signal 202 to switch states (from low to high) is control signal 202C. When control signal 202C switches to a high state, switches 110L close, which causes the outputs of auto-zeroing OTA 124B to be coupled to the output amplifier 158. After signals 202A and 202C have gone high, auto-zeroing OTA 124B begins operating in the normal mode.

The next control signal 202 to switch states (from high to low) is control signal 202B. When control signal 202B switches to a low state, switches 110A open, which causes the inputs of OTA 116 to be decoupled from the differential inputs 102 and 106. The next control signal 202 to switch states (from low to high) is control signal 202E. When control signal 202E switches to a high state, switches 110B close, which causes the inputs of OTA 116 to be coupled to the common mode potential 104.

The next control signal 202 to switch states (from low to high) is control signal 202G. When control signal 202G switches to a high state, switches 110C, 110D, and 110E close, which causes the feed back loops for OTA 122 to be closed, and causes the outputs of auto-zeroing OTA 124A to be coupled to the common mode potential 156. When switches 110C, 110D, and 110E close, auto-zeroing OTA 124A is in the auto-zeroing mode.

The next control signal 202 to switch states (from high to low) is again control signal 202G. When control signal 202G switches to a low state, switches 110C, 110D, and 110E open, which causes the feed back loops for OTA 122 to be opened, and causes the outputs of auto-zeroing OTA 124A to be decoupled from the common mode potential 156. The next control signal 202 to switch states (from high to low) is control signal 202E. When control signal 202E switches to a low state, switches 110B open, which causes the inputs of OTA 116 to be decoupled from the common mode potential 104.

The next control signal 202 to switch states (from low to high) is control signal 202B. When control signal 202B switches to a high state, switches 110A close, which causes the inputs of OTA 116 to be coupled to the differential inputs 102 and 106. The next control signal 202 to switch states (from low to high) is control signal 202D. When control signal 202D switches to a high state, switches 110F close, which causes the outputs of auto-zeroing OTA 124A to be coupled to the output amplifier 158. After signals 202B and 202D have gone high, auto-zeroing OTA 124A begins operating in the normal mode.

The next control signal 202 to switch states (from high to low) is control signal 202C. When control signal 202C switches to a low state, switches 110L open, which causes the outputs of auto-zeroing OTA 124B to be decoupled from the output amplifier 158. The next control signal 202 to switch states (from high to low) is control signal 202A. When control signal 202A switches to a low state, switches 110G open, which causes the differential inputs 102 and 106 to be decoupled from the inputs of OTA 166.

The next control signal 202 to switch states (from low to high) is control signal 202F. When control signal 202F switches to a high state, switches 110H close, which causes the inputs of OTA 166 to be coupled to the common mode potential 104. The next control signal 202 to switch states (from low to high) is control signal 202H. When control signal 202H switches to a high state, switches 110I, 110J, and 110K close, which causes the feed back loops for OTA 172 to be closed, and causes the outputs of auto-zeroing OTA 124B to be coupled to the common mode potential 156. When switches 110I, 110J, and 110K close, auto-zeroing OTA 124B is in the auto-zeroing mode.

The next control signal 202 to switch states (from high to low) is again control signal 202H. When control signal 202H switches to a low state, switches 110I, 110J, and 110K open, which causes the feed back loops for OTA 172 to be opened, and causes the outputs of auto-zeroing OTA 124B to be decoupled from the common mode potential 156. The next control signal 202 to switch states (from high to low) is control signal 202F. When control signal 202F switches to a low state, switches 110H open, which causes the inputs of OTA 166 to be decoupled from the common mode potential 104. The next control signal 202 to switch states (from low to high) is control signal 202A, which marks the end of the current cycle 204 and the beginning of the next cycle.

In the embodiment illustrated in FIG. 1, two comparator stages 101A and 101B are connected in parallel to the inputs 102 and 106. In another embodiment, more than two comparator stages are connected to the inputs 102 and 106. In one embodiment, one or more of the comparator stages goes into an auto-zeroing mode to compensate the comparator offset voltage of that stage, while one or more of the remaining comparator stages operates in a normal mode to compare the input signal and operate on the output amplifier 158. In the normal mode according to one embodiment, the comparator stages 101A and 101B receive a differential input signal on inputs 102 and 104, perform a comparison on the received differential input signal, and provide an output signal based on the comparison. In one embodiment, one of the comparator stages at a time is cyclically: (1) decoupled from the input signal (e.g., via switches 110A) and output amplifier (e.g., via switches 110F); (2) short circuited at its inputs (e.g., via switches 110B to connect both of its inputs to common mode potential 104); (3) short-circuited at its outputs (e.g., via switches 110E to connect both of its outputs to common mode potential 156); and (4) auto-zeroed using an offset-memory OTA (e.g., OTA 122). In one embodiment, the comparator stages take turns going into an auto-zeroing mode in a staggered manner, while the other comparator stage or stages continue to operate in the normal mode to compare the input signals and operate on the output amplifier 158. Thus, the comparator stages cyclically switch between a normal mode and an auto-zeroing mode in a staggered manner, thereby compensating offset voltages of the comparator stages while providing a continuous-time digital comparator output signal.

During the auto-zeroing mode of a comparator stage according to one embodiment, the larger (i.e., higher transconductance) OTA in the stage (e.g., OTA 116 in stage 101A) is fed back by the smaller offset-memory OTA (e.g., OTA 122), as a result of which the input offset adjusts, amplified by the transconductance ratio of the two OTAs in the stage. In one embodiment, the transconductance ratio is ten (i.e., GM/(GM/10)). In one embodiment, the input offset is stored on the differential capacitors in the stage (e.g., capacitors 138 and 140 in stage 101A), and the stored offset is used to compensate the offset error during the normal mode. In one embodiment, the differential voltage between the capacitors (e.g., capacitors 138 and 140) after the auto-zeroing mode will be ten times the input offset voltage. At the same time that the input offset is stored for a comparator stage during the auto-zeroing mode, the output offset of the first OTA (e.g., OTA 116 in stage 101A) in the stage is stored on the coupling capacitors (e.g., coupling capacitors 142 and 146 in stage 101A) for the stage, which are shorted at the output of the stage during the auto-zeroing mode (e.g., via switches 110E to connect both of the outputs to common mode potential 156), as a result of which the output offset will be compensated during the normal mode.

After a comparator stage completes the auto-zeroing mode and enters the normal-mode according to one embodiment, the output of the stage will start at an ideal differential zero point, and will depart from this point when a small differential signal is applied to the input. It is noted that the outputs of each comparator stage are capacitively coupled to the output amplifier 158 in one embodiment. In one embodiment, the DC potential is continually established via the coupling capacitors (e.g., capacitors 142 and 146) by the defined operating point during the auto-zeroing mode. Furthermore, one of the OTAs cyclically refreshes the DC potential of the coupling capacitors. The differential operating point is hence defined for the input of the output amplifier 158. At the same time, the common-mode operating point is defined (and capacitively refreshed) by the fixed common mode potential 156.

In one embodiment, comparator device 100 is configured to perform three functions simultaneously: (1) Cyclic offset compensation of the comparator stages; (2) time-continuous (non-sampled) comparator operating mode so that at least one comparator stage is comparing the input signals and operating on the output amplifier 158 at any given time; and (3) capacitive transfer of the differential and common-mode operating points from one sub-transconductance stage of the comparator to the other transconductance stages.

Figure 3:
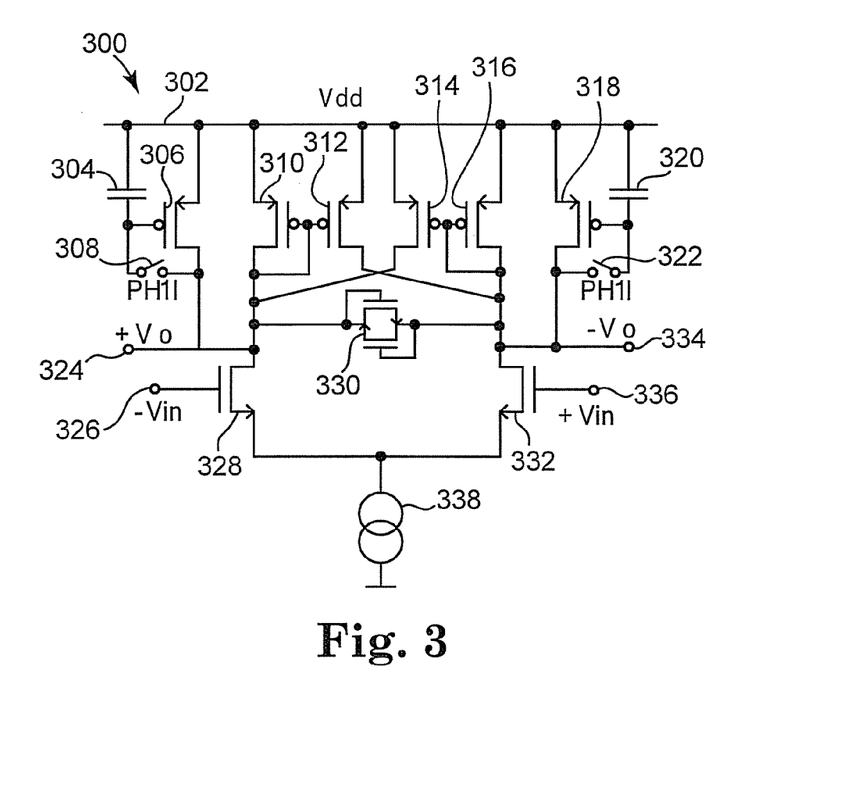
FIG. 3 is a schematic diagram illustrating an auto-zeroing operational transconductance amplifier according to one embodiment.

FIG. 3 is a schematic diagram illustrating an auto-zeroing operational transconductance amplifier (OTA) 300 according to one embodiment. In one embodiment, auto-zeroing OTAs 124A and 124B (FIG. 1) are each implemented as shown in FIG. 3 for OTA 300. OTA 300 includes capacitors 304 and 320, P-channel field effect transistors (PFETs) 306, 310, 312, 314, 316, and 318, switches 308 and 322, clamping device 330, differential outputs 324 and 334 (+Vo and −Vo, respectively), differential inputs 326 and 336 (−Vin and +Vin, respectively), N-channel field effect transistors (NFETs) 328 and 332, and current source 338.

Transistors 328 and 332 are configured as a differential pair. The gate of transistor 328 is coupled to input 326, and the gate of transistor 332 is coupled to input 336. The sources of transistors 328 and 332 are coupled to current source 338. Clamping device 330 is coupled between the drains of transistors 328 and 332. Output 324 is coupled to the drain of transistor 328, and output 334 is coupled to the drain of transistor 332. The drains of transistors 306, 310, 312, 314, 316, and 318 are connected to voltage supply line (Vdd) 302. Capacitor 304 is coupled between voltage supply line 302 and the gate of transistor 306. Switch 308 is connected between the gate of transistor 306 and the source of transistor 306. The source of transistor 306 is coupled to output 324. The gate of transistor 310 is coupled to the source of transistor 310, and is coupled to the gate of transistor 312. The source of transistor 310 is coupled to the drain of transistor 328. The gate of transistor 312 is coupled to the gate of transistor 310. The source of transistor 312 is coupled to the source of transistor 316, which is coupled to the drain of transistor 332. The source of transistor 314 is coupled to the source of transistor 310, which is coupled to the drain of transistor 328. The gate of transistor 314 is coupled to the gate of transistor 316. The source of transistor 316 is coupled to the drain of transistor 332. The gate of transistor 316 is connected to the gate of transistor 314 and to the source of transistor 316. Capacitor 320 is coupled between voltage supply line 302 and the gate of transistor 318. Switch 322 is connected between the gate of transistor 318 and the source of transistor 318. The source of transistor 318 is coupled to output 334.

When auto-zeroing OTA 124A (FIG. 1), for example, is implemented with OTA 300, transistors 328 and 332 in OTA 300 correspond to OTA 116; transistors 306 and 318 correspond to OTA 122; capacitor 304 corresponds to capacitor 138; capacitor 320 corresponds to capacitor 140; switch 308 corresponds to switch 110C; switch 322 corresponds to switch 110D; differential inputs 326 and 336 correspond to signal paths 112 and 114; and differential outputs 324 and 334 correspond to signal paths 126 and 128. Transistors 310, 312, 314, and 316 form a current source for OTA 300, and make relatively high amplification possible due to the cross-coupling. Clamping device 330 clamps the maximum output voltage to keep it within a threshold level to help prevent saturation and to provide a fast response time. In one embodiment, transistors 312 and 314 each have a width over length ratio of eight; transistors 310, 316, 328, and 332 each have a width over length ratio of ten; and transistors 306 and 318 each have a width over length ratio of two.

Figure 4:
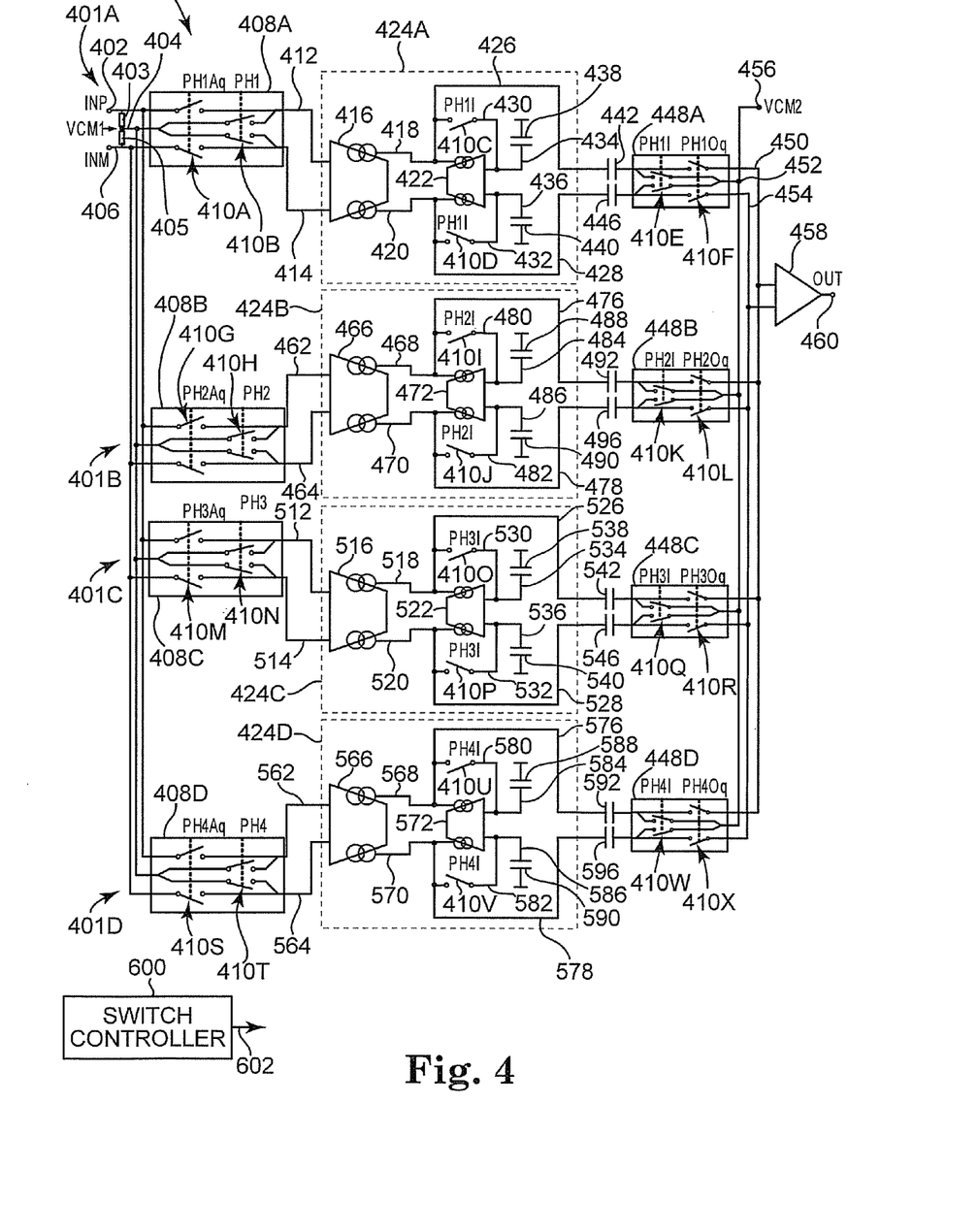
FIG. 4 is a diagram illustrating a continuous-time comparator device with offset compensation according to another embodiment.

FIG. 4 is a diagram illustrating a continuous-time comparator device 400 with offset compensation according to another embodiment. Comparator device 400 includes four auto-zeroing comparator stages 401A-401D and output amplifier 458. The comparator stages 401A-401D are coupled in parallel between differential inputs 402 and 406 of device 400 and differential outputs 450 and 454. Comparator stage 401A includes input multiplexer 408A, auto-zeroing comparator 424A, coupling capacitors 442 and 446, and output multiplexer 448A. Coupling capacitors 442 and 446 capacitively couple outputs of auto-zeroing comparator 424A to output multiplexer 448A and output amplifier 458. Input multiplexer 408A includes input switches 410A and 410B. Output multiplexer 448A includes output switches 410E and 410F. Auto-zeroing comparator 424A includes operational transconductance amplifier (OTA) 416, OTA 422, switches 410C and 410D, and differential capacitors 438 and 440. In one embodiment, OTA 422 has a transconductance value (GM/10), which is one tenth the transconductance value (GM) of OTA 416.

Input multiplexer 408A is coupled to differential inputs 402 and 406 (INP and INM, respectively), and is coupled to common mode input potential 404 (VCM1). Differential inputs 402 and 406 are configured to be coupled to respective first and second inputs of OTA 416 through switches 410A and signal paths 412 and 414, respectively. Common mode potential 404 is configured to be coupled to the first and second inputs of OTA 416 through switches 410B and signal paths 412 and 414. Resistor 403 is coupled between differential input 402 and common mode potential 404. Resistor 405 is coupled between common mode potential 404 and differential input 406. In one embodiment, resistors 403 and 405 have equal resistance values, and the voltage at the common mode potential 404 is equal to the mean value of the differential inputs 402 and 406.

First and second outputs of OTA 416 are coupled to signal paths 418 and 420, respectively. Capacitor 438 is coupled between a voltage source (or ground), and a first input of OTA 422 (via signal path 434). Capacitor 440 is coupled between the voltage source (or ground), and a second input of OTA 422 (via signal path 436). First and second outputs of OTA 422 are coupled to signal paths 418 and 420, respectively. The first output of OTA 422 is configured to be coupled to the first input of OTA 422 through feedback signal path 430 and switch 410C. The second output of OTA 422 is configured to be coupled to the second input of OTA 422 through feedback signal path 432 and switch 410D.

The first outputs of OTAs 416 and 422 are coupled to coupling capacitor 442 through signal paths 418 and 426. The second outputs of OTAs 416 and 422 are coupled to coupling capacitor 446 through signal paths 420 and 428. Coupling capacitors 442 and 446 are configured to be coupled to respective first and second inputs of output amplifier 458 through switches 410F and differential signal paths 450 and 454, respectively. Coupling capacitors 442 and 446 are also configured to be coupled to common mode output potential 456 (VCM2) through switches 410E and common mode signal path 452.

In the illustrated embodiment, comparator stage 401B includes the same elements and is configured in the same manner as comparator stage 401A. Comparator stage 401B includes input multiplexer 408B, auto-zeroing comparator 424B, coupling capacitors 492 and 496, and output multiplexer 448B. Coupling capacitors 492 and 496 capacitively couple outputs of auto-zeroing comparator 424B to output multiplexer 448B and output amplifier 458. Input multiplexer 408B includes input switches 410G and 410H. Output multiplexer 448B includes output switches 410K and 410L. Auto-zeroing comparator 424B includes operational transconductance amplifier (OTA) 466, OTA 472, switches 410I and 410J, and differential capacitors 488 and 490. In one embodiment, OTA 472 has a transconductance value (GM/10), which is one tenth the transconductance value (GM) of OTA 466.

Input multiplexer 408B is coupled to differential inputs 402 and 406 (INP and INM, respectively), and is coupled to common mode input potential 404 (VCM1). Differential inputs 402 and 406 are configured to be coupled to respective first and second inputs of OTA 466 through switches 410G and signal paths 462 and 464, respectively. Common mode potential 404 is configured to be coupled to the first and second inputs of OTA 466 through switches 410H and signal paths 462 and 464. First and second outputs of OTA 466 are coupled to signal paths 468 and 470, respectively. Capacitor 488 is coupled between a voltage source (or ground), and a first input of OTA 472 (via signal path 484). Capacitor 490 is coupled between the voltage source (or ground), and a second input of OTA 472 (via signal path 486). First and second outputs of OTA 472 are coupled to signal paths 468 and 470, respectively. The first output of OTA 472 is configured to be coupled to the first input of OTA 472 through feedback signal path 480 and switch 410I. The second output of OTA 472 is configured to be coupled to the second input of OTA 472 through feedback signal path 482 and switch 410J.

The first outputs of OTAs 466 and 472 are coupled to coupling capacitor 492 through signal paths 468 and 476. The second outputs of OTAs 466 and 472 are coupled to coupling capacitor 496 through signal paths 470 and 478. Coupling capacitors 492 and 496 are configured to be coupled to respective first and second inputs of output amplifier 458 through switches 410L and differential signal paths 450 and 454, respectively. Coupling capacitors 492 and 496 are also configured to be coupled to common mode output potential 456 (VCM2) through switches 410K and common mode signal path 452.

In the illustrated embodiment, comparator stage 401C includes the same elements and is configured in the same manner as comparator stages 401A and 401B. Comparator stage 401C includes input multiplexer 408C, auto-zeroing comparator 424C, coupling capacitors 542 and 546, and output multiplexer 448C. Coupling capacitors 542 and 546 capacitively couple outputs of auto-zeroing comparator 424C to output multiplexer 448C and output amplifier 458. Input multiplexer 408C includes input switches 410M and 410N. Output multiplexer 448C includes output switches 410Q and 410R. Auto-zeroing comparator 424C includes operational transconductance amplifier (OTA) 516, OTA 522, switches 410O and 410P, and differential capacitors 538 and 540. In one embodiment, OTA 522 has a transconductance value (GM/10), which is one tenth the transconductance value (GM) of OTA 516.

Input multiplexer 408C is coupled to differential inputs 402 and 406 (INP and INM, respectively), and is coupled to common mode input potential 404 (VCM1). Differential inputs 402 and 406 are configured to be coupled to respective first and second inputs of OTA 516 through switches 410M and signal paths 512 and 514, respectively. Common mode potential 404 is configured to be coupled to the first and second inputs of OTA 516 through switches 410N and signal paths 512 and 514. First and second outputs of OTA 516 are coupled to signal paths 518 and 520, respectively. Capacitor 538 is coupled between a voltage source (or ground), and a first input of OTA 522 (via signal path 534). Capacitor 540 is coupled between the voltage source (or ground), and a second input of OTA 522 (via signal path 536). First and second outputs of OTA 522 are coupled to signal paths 518 and 520, respectively. The first output of OTA 522 is configured to be coupled to the first input of OTA 522 through feedback signal path 530 and switch 410O. The second output of OTA 522 is configured to be coupled to the second input of OTA 522 through feedback signal path 532 and switch 410P.

The first outputs of OTAs 516 and 522 are coupled to coupling capacitor 542 through signal paths 518 and 526. The second outputs of OTAs 516 and 522 are coupled to coupling capacitor 546 through signal paths 520 and 528. Coupling capacitors 542 and 546 are configured to be coupled to respective first and second inputs of output amplifier 458 through switches 410R and differential signal paths 450 and 454, respectively. Coupling capacitors 542 and 546 are also configured to be coupled to common mode output potential 456 (VCM2) through switches 410Q and common mode signal path 452.

In the illustrated embodiment, comparator stage 401D includes the same elements and is configured in the same manner as comparator stages 401A-401C. Comparator stage 401D includes input multiplexer 408D, auto-zeroing comparator 424D, coupling capacitors 592 and 596, and output multiplexer 448D. Coupling capacitors 592 and 596 capacitively couple outputs of auto-zeroing comparator 424D to output multiplexer 448D and output amplifier 458. Input multiplexer 408D includes input switches 410S and 410T. Output multiplexer 448D includes output switches 410W and 410X. Auto-zeroing comparator 424D includes operational transconductance amplifier (OTA) 566, OTA 572, switches 410U and 410V, and differential capacitors 588 and 590. In one embodiment, OTA 572 has a transconductance value (GM/10), which is one tenth the transconductance value (GM) of OTA 566.

Input multiplexer 408D is coupled to differential inputs 402 and 406 (INP and INM, respectively), and is coupled to common mode input potential 404 (VCM1). Differential inputs 402 and 406 are configured to be coupled to respective first and second inputs of OTA 566 through switches 410S and signal paths 562 and 564, respectively. Common mode potential 404 is configured to be coupled to the first and second inputs of OTA 566 through switches 410T and signal paths 562 and 564. First and second outputs of OTA 566 are coupled to signal paths 568 and 570, respectively. Capacitor 588 is coupled between a voltage source (or ground), and a first input of OTA 572 (via signal path 584). Capacitor 590 is coupled between the voltage source (or ground), and a second input of OTA 572 (via signal path 586). First and second outputs of OTA 572 are coupled to signal paths 568 and 570, respectively. The first output of OTA 572 is configured to be coupled to the first input of OTA 572 through feedback signal path 580 and switch 410U. The second output of OTA 572 is configured to be coupled to the second input of OTA 572 through feedback signal path 582 and switch 410V.

The first outputs of OTAs 566 and 572 are coupled to coupling capacitor 592 through signal paths 568 and 576. The second outputs of OTAs 566 and 572 are coupled to coupling capacitor 596 through signal paths 570 and 578. Coupling capacitors 592 and 596 are configured to be coupled to respective first and second inputs of output amplifier 458 through switches 410x and differential signal paths 450 and 454, respectively. Coupling capacitors 592 and 596 are also configured to be coupled to common mode output potential 456 (VCM2) through switches 410W and common mode signal path 452. Output amplifier 458 amplifies signals received at its inputs on signal paths 450 and 454 and outputs a digital comparator output signal (OUT) on signal path 460.

In one embodiment, comparator device 400 includes a switch controller 600 for generating switch control signals 602 that control switches 410A-410X. In one embodiment, comparator device 400 and switch controller 600 are implemented together in a common integrated circuit. In another embodiment, comparator device 400 and switch controller 600 are implemented with separate integrated circuits. Control signals 602, and the operation of comparator device 400 according to one embodiment, are described in further detail below with reference to FIG. 5.

Figure 5:
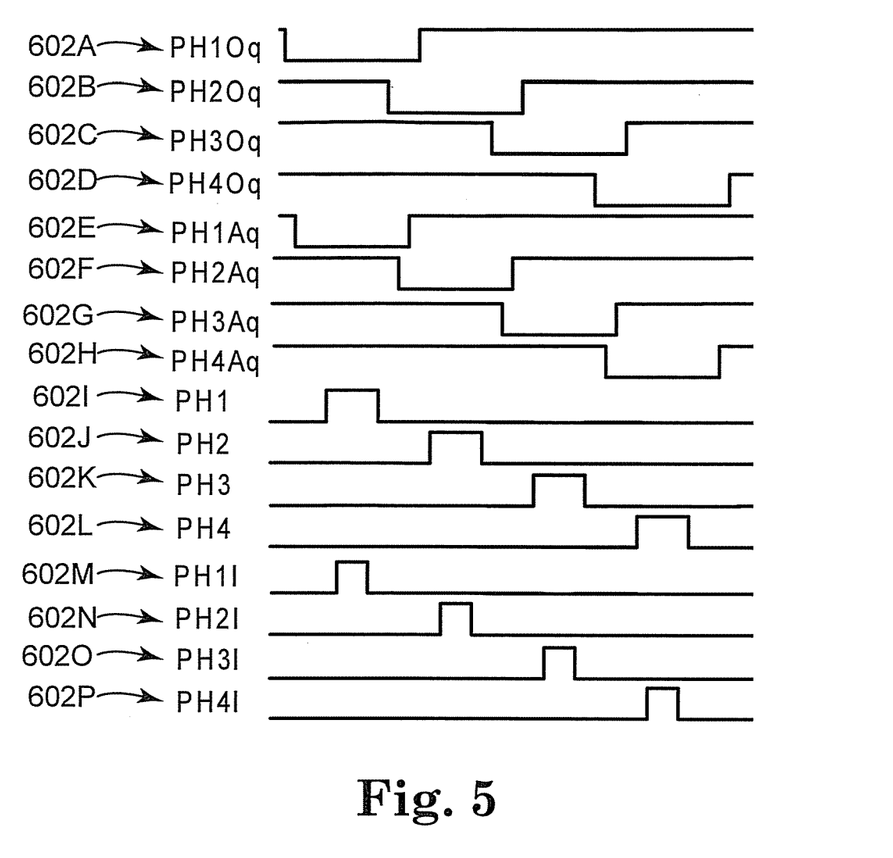
FIG. 5 is a timing diagram illustrating switch control signals for controlling switches of the comparator device shown in FIG. 4 according to one embodiment.

FIG. 5 is a timing diagram illustrating switch control signals 602A-602P (collectively referred to as switch control signals 602) for controlling switches 410A-410X (collectively referred to as switches 410) of the comparator device 400 shown in FIG. 4 according to one embodiment. In one embodiment, a high value or state for any of the switch signals 602 shown in FIG. 5 indicates that the switches 410 controlled by that signal are closed, and a low value or state indicates that the switches are open. Control signal 602A (PH1Oq) controls switches 410F. Control signal 602B (PH2Oq) controls switches 410L. Control signal 602C (PH3Oq) controls switches 410R. Control signal 602D (PH4Oq) controls switches 410X. Control signal 602E (PH1Aq) controls switches 410A. Control signal 602F (PH2Aq) controls switches 410G. Control signal 602G (PH3Aq) controls switches 410M. Control signal 602H (PH4Aq) controls switches 410S. Control signal 602I (PH1) controls switches 410B. Control signal 602J (PH2) controls switches 410H. Control signal 602K (PH3) controls switches 410N. Control signal 602L (PH4) controls switches 410T. Control signal 602M (PH1I) controls switches 410C, 410D, and 410E. Control signal 602N (PH2I) controls switches 410I, 410J, and 410K. Control signal 602O (PH3I) controls switches 410O, 410P, and 410Q. Control signal 602P (PH4I) controls switches 410U, 410V, and 410W.

Control signals 602 are defined in essentially the same manner as control signals 202, which were described above with respect to FIG. 2, but since more comparator stages are included in comparator device 400 than comparator device 100, additional control signals 602 are used to control the additional stages. The control signals 602 are configured to cyclically cause one comparator stage at a time in a staggered manner to enter the auto-zeroing mode, while the other three comparator stages are in the normal mode to receive and compare the differential input signals and operate on the output amplifier 458.

In the embodiment shown in FIG. 4, the comparator device 400 includes four auto-zeroing OTAs 424A-424D. In one embodiment, at least one of the OTAs 424A-424D is coupled between the differential inputs 402 and 406 and the differential outputs 450 and 454 and compare the input signal at any given time to provide time-continuous (non-sampled) operation. In one form of this embodiment, at least three of the OTAs 424A-424D are coupled between the differential inputs 402 and 406 and the differential outputs 450 and 454 and compare the input signal at any given time to provide time-continuous (non-sampled) operation. In one embodiment, comparator device 400 includes N auto-zeroing OTAs, where N is an integer greater than one, and at least N-1 of the auto-zeroing OTAs are coupled between the differential inputs 402 and 406 and the differential outputs 450 and 454 and compare the input signal at any given time to provide time-continuous (non-sampled) operation. The offset errors of each auto-zeroing OTA are cyclically determined for each OTA during an auto-zeroing mode, capacitively stored, and used to compensate the offset during the normal mode. The differential and common-mode operating points are each set during the auto-zeroing mode, capacitively stored, and capacitively transferred to the overall comparator's operating points. In one embodiment, the input offsets of the OTAs 424A-424D are compensated by negative feedback OTAs (e.g., OTAs 422, 472, 522, and 572, respectively), and the output offsets of the OTAs 424A-424D are cyclically stored on the coupling capacitors (e.g., capacitors 442 and 446;
capacitors 492 and 496; capacitors 542 and 546; and capacitors 592 and 596; respectively).

Figure 6:
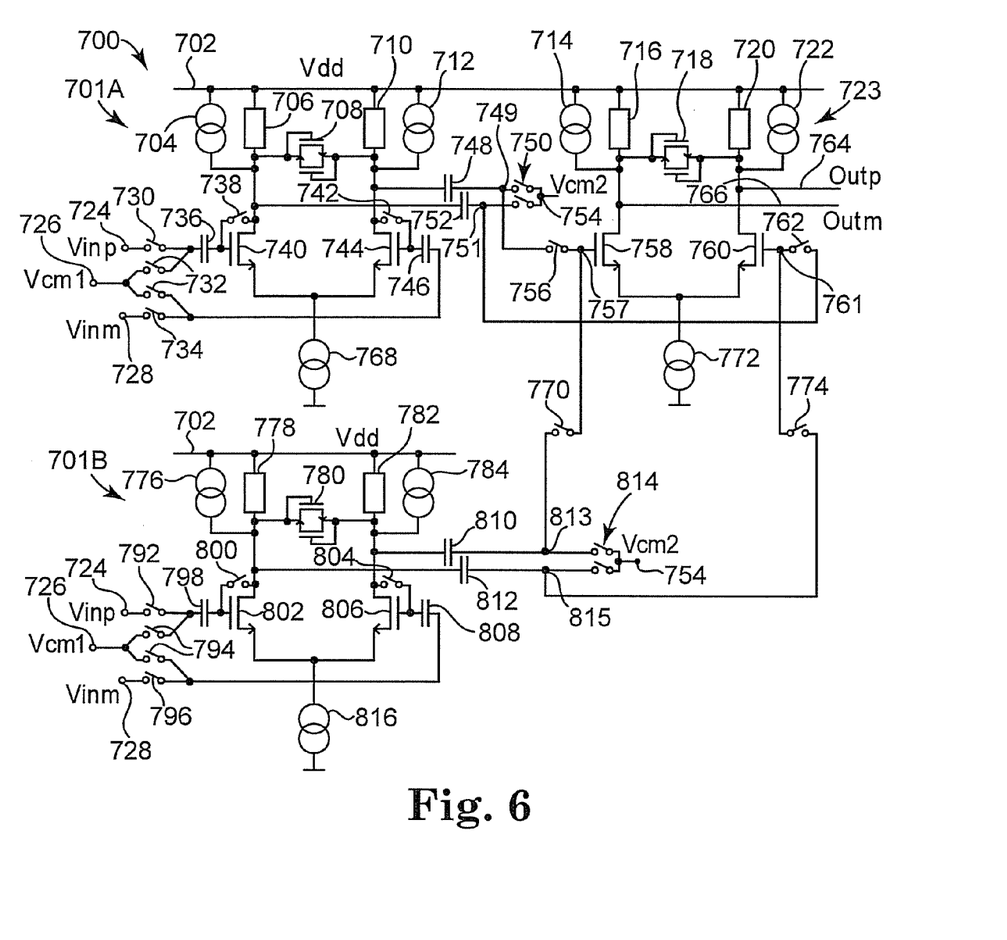
FIG. 6 is a schematic diagram illustrating a continuous-time comparator device with offset compensation according to another embodiment.

FIG. 6 is a schematic diagram illustrating a continuous-time comparator device 700 with offset compensation according to another embodiment. Comparator device 700 includes two comparator stages 701A and 701B and output amplifier 723. Comparator stage 701A includes current sources 704, 712, and 768, resistors 706 and 710, clamping device 708, N-channel field effect transistors (NFETs) 740 and 744, feedback switches 738 and 742, input switches 730, 732, and 734, capacitors 736 and 746, coupling capacitors 748 and 752, and output switches 750, 756, and 762. Coupling capacitors 748 and 752 capacitively couple outputs of comparator stage 701A to output amplifier 723.

Input switches 730 and 734 are coupled between differential inputs 724 and 728 (Vinp and Vinm, respectively) and capacitors 736 and 746, respectively. Input switches 732 are coupled between common mode input potential 726 (VCM1) and capacitors 736 and 746. Capacitor 736 is coupled to the gate of transistor 740, and capacitor 746 is coupled to the gate of transistor 744. Transistors 740 and 744 are configured as a differential pair. The sources of transistors 740 and 744 are coupled to current source 768. The drain of transistor 740 is coupled to the gate of transistor 740 via feedback switch 738. The drain of transistor 744 is coupled to the gate of transistor 744 via feedback switch 742.

Current source 704 and resistor 706 are each coupled between voltage supply line (Vdd) 702 and the drain of transistor 740. Current source 712 and resistor 710 are each coupled between the voltage supply line 702 and the drain of transistor 744. Clamping device 708 is coupled between the drains of transistors 740 and 744. The drain of transistor 744 is coupled to node 749 via coupling capacitor 748. The drain of transistor 740 is coupled to node 751 via coupling capacitor 752. Common mode output potential (VCM2) is coupled to nodes 749 and 751 via switches 750. Nodes 749 and 751 are coupled to respective nodes 757 and 761 via switches 756 and 762, respectively.

In the illustrated embodiment, comparator stage 701B includes the same elements and is configured in the same manner as comparator stage 701A. Comparator stage 701B includes current sources 776, 784, and 816, resistors 778 and 782, clamping device 780, N-channel field effect transistors (NFETs) 802 and 806, feedback switches 800 and 804, input switches 792, 794, and 796, capacitors 798 and 808, coupling capacitors 810 and 812, and output switches 814, 770, and 774. Coupling capacitors 810 and 812 capacitively couple outputs of comparator stage 701B to output amplifier 723.

Input switches 792 and 796 are coupled between differential inputs 724 and 728 (Vinp and Vinm, respectively) and capacitors 798 and 808, respectively. Input switches 794 are coupled between common mode input potential 726 (VCM1) and capacitors 798 and 808. Capacitor 798 is coupled to the gate of transistor 802, and capacitor 808 is coupled to the gate of transistor 806. Transistors 802 and 806 are configured as a differential pair. The sources of transistors 802 and 806 are coupled to current source 816. The drain of transistor 802 is coupled to the gate of transistor 802 via feedback switch 800. The drain of transistor 806 is coupled to the gate of transistor 806 via feedback switch 804.

Current source 776 and resistor 778 are each coupled between the voltage supply line (Vdd) 702 and the drain of transistor 802. Current source 784 and resistor 782 are each coupled between the voltage supply line 702 and the drain of transistor 806. Clamping device 780 is coupled between the drains of transistors 802 and 806. The drain of transistor 806 is coupled to node 813 via coupling capacitor 810. The drain of transistor 802 is coupled to node 815 via coupling capacitor 812. Common mode output potential (VCM2) is coupled to nodes 813 and 815 via switches 814. Nodes 813 and 815 are coupled to respective nodes 757 and 761 via switches 770 and 774, respectively.

Output amplifier 723 includes current sources 714, 722, and 772, resistors 716 and 720, clamping device 718, and N-channel field effect transistors (NFETs) 758 and 760. Transistors 758 and 760 are configured as a differential pair. The gates of transistors 758 and 760 are coupled to nodes 757 and 761, respectively. The sources of transistors 758 and 760 are coupled to current source 772. Current source 714 and resistor 716 are each coupled between the voltage supply line (Vdd) 702 and the drain of transistor 758. Current source 722 and resistor 720 are each coupled between the voltage supply line 702 and the drain of transistor 760. Clamping device 718 is coupled between the drains of transistors 758 and 760. The drain of transistor 760 is coupled to output node 764. The drain of transistor 758 is coupled to output node 766 (Outp).

In one embodiment, comparator device 700 is configured to be controlled in the same manner as device 100 (FIG. 1) and device 400 (FIG. 4) to cause the comparator stages to take turns going into an auto-zeroing mode in a staggered manner, while the other comparator stage or stages continue to operate in the normal mode to compare the input signals and operate on the output amplifier. Thus, the comparator stages cyclically switch between a normal mode and an auto-zeroing mode in a staggered manner, thereby compensating offset voltages of the comparator stages while providing a continuous-time digital comparator output signal.

For comparator device 700, the input offset voltages are stored on capacitors 736 and 746 (for stage 701A) and on capacitors 798 and 808 (for stage 701B), and the output offset voltages are stored on coupling capacitors 748 and 752 (for stage 701A) and on coupling capacitors 810 and 812 (for stage 701B). The switches for comparator device 700 are operated in one embodiment in the same manner as described above with respect to FIG. 2 to cause a cyclic switching of the stages 701A and 701B back and forth between the normal mode and the auto-zeroing mode, such that at least one of the stages 701A and 701B is operating in the normal mode at any given time to provide time-continuous comparator operation. In one embodiment, switches in device 700 correspond to switches in device 100 as follows: Switches 730 and 734 correspond to switches 110A; switches 732 correspond to switches 110B; switch 738 corresponds to switch 110C; switch 742 corresponds to switch 110D; switches 750 correspond to switches 110E; switches 756 and 762 correspond to switches 110F; switches 792 and 796 correspond to switches 110G; switches 794 correspond to switches 110H; switch 800 corresponds to switch 110I; switch 804 corresponds to switch 110J; switches 814 correspond to switches 110K; and switches 770 and 774 correspond to switches 110L.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
    first and second inputs configured to receive an input signal;
    a plurality of comparator stages coupled in parallel to the first and second inputs, each comparator stage configured to perform a comparison on the input signal and provide an output signal based on the comparison; and
    a control circuit configured to cause the comparator stages to switch to an auto-zeroing mode in a staggered manner, thereby compensating offset voltages of the comparator stages while providing a continuous-time digital output signal.

2. The integrated circuit of claim 1, wherein each comparator stage includes an auto-zeroing operational transconductance amplifier (OTA).

3. The integrated circuit of claim 2, and further comprising a set of input switches for each comparator stage, the input switches for each comparator stage configured to decouple the auto-zeroing OTA for the stage from the first and second inputs for the auto-zeroing mode.

4. The integrated circuit of claim 3, wherein the set of input switches for each comparator stage is configured to couple inputs of the auto-zeroing OTA for the stage to a common mode potential for the auto-zeroing mode.

5. The integrated circuit of claim 2, and further comprising an output amplifier, and wherein the comparator stages are coupled in parallel to the output amplifier.

6. The integrated circuit of claim 5, and further comprising a set of output switches for each comparator stage, the output switches for each comparator stage configured to decouple outputs of the auto-zeroing OTA for the stage from the output amplifier for the auto-zeroing mode.

7. The integrated circuit of claim 6, wherein the set of output switches for each comparator stage is configured to couple outputs of the auto-zeroing OTA for the stage to a common mode potential for the auto-zeroing mode.

8. The integrated circuit of claim 2, wherein the auto-zeroing OTA for each comparator stage includes a first OTA configured to be coupled to the first and second inputs, and a second OTA having switch-controlled feedback loops and inputs coupled to first and second capacitors.

9. The integrated circuit of claim 8, wherein the first and second capacitors are configured to store an input offset voltage of the auto-zeroing OTA.

10. The integrated circuit of claim 1, wherein each comparator stage further comprises first and second coupling capacitors configured to capacitively couple outputs of the comparator stage to an output amplifier.

11. The integrated circuit of claim 10, wherein the coupling capacitors for each comparator stage are configured to store an output offset of the comparator stage.

12. The integrated circuit of claim 1, wherein the plurality of comparator stages includes four comparator stages.

13. The integrated circuit of claim 12, wherein the control circuit is configured to cause one of the comparator stages at a time to switch to the auto-zeroing mode while the other three comparator stages are in a normal mode and provide continuous-time output signals.

14. The integrated circuit of claim 1, wherein the input signal is a differential input signal.

15. An offset-compensated continuous-time comparator, comprising:
    a plurality of auto-zeroing operational transconductance amplifiers (OTAs) coupled in parallel to differential inputs of the comparator, each auto-zeroing OTA configured to perform a comparison on a differential input signal and provide an output signal based on the comparison;
    an output amplifier capacitively coupled to each of the auto-zeroing OTAs; and a control circuit configured to cause the auto-zeroing OTAs to cyclically switch between a normal mode and an auto-zeroing mode in a staggered manner, thereby compensating offset voltages of the auto-zeroing OTAs while providing a continuous-time digital output signal.

16. The comparator of claim 15, and further comprising a set of input switches for each auto-zeroing OTA, the input switches for each auto-zeroing OTA configured to decouple the OTA from the differential inputs for the auto-zeroing mode.

17. The comparator of claim 16, wherein the set of input switches for each auto-zeroing OTA is configured to couple inputs of the auto-zeroing OTA to a common mode potential for the auto-zeroing mode.

18. The comparator of claim 15, and further comprising a set of output switches for each auto-zeroing OTA, the output switches for each auto-zeroing OTA configured to decouple outputs of the auto-zeroing OTA from the output amplifier for the auto-zeroing mode.

19. The comparator of claim 18, wherein the set of output switches for each auto-zeroing OTA is configured to couple outputs of the auto-zeroing OTA to a common mode potential for the auto-zeroing mode.

20. A method of compensating an offset voltage of a comparator, the method comprising:
- providing a plurality of auto-zeroing comparator stages coupled in parallel between a pair of differential inputs and at least one output;
- decoupling a first one of the auto-zeroing comparator stages from the differential inputs and the at least one output;
- coupling the first auto-zeroing comparator stage between a common mode input potential and a common mode output potential;
- causing the first auto-zeroing comparator stage to determine an offset voltage of the stage; and
- outputting a continuous-time comparator signal from at least one of the auto-zeroing comparator stages while the first auto-zeroing stage is decoupled from the differential inputs and the at least one output.

* * * * *